(12) United States Patent
Singh (10) Patent No.: US 6,877,046 B2
(45) Date of Patent: Apr. 5, 2005

(54) METHOD AND APPARATUS FOR MEMORY WITH EMBEDDED PROCESSOR

(75) Inventor: Shanker Singh, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 10/112,213

(22) Filed: Mar. 29, 2002

(65) Prior Publication Data

US 2003/0188086 A1 Oct. 2, 2003

(51) Int. Cl.⁷ .................... G06F 12/06; G06F 9/28
(52) U.S. Cl. .................................. 710/21; 711/173
(58) Field of Search ........................ 711/117, 112, 711/128, 168, 160, 173, 170; 710/22, 20, 21, 35; 345/568

(56) References Cited

U.S. PATENT DOCUMENTS

| | | | | |
|---|---|---|---|---|
| 4,747,070 A | * | 5/1988 | Trottier et al. | 345/568 |
| 5,025,366 A | * | 6/1991 | Baror | 711/128 |
| 5,047,920 A | * | 9/1991 | Funabashi | 711/117 |
| 5,553,082 A | | 9/1996 | Connor et al. | |
| 5,751,987 A | | 5/1998 | Mahant-Shetti et al. | |
| 5,784,611 A | | 7/1998 | Thantrakul | |
| 5,809,280 A | * | 9/1998 | Chard et al. | 711/160 |
| 6,012,106 A | * | 1/2000 | Schumann et al. | 710/22 |
| 6,076,150 A | * | 6/2000 | Kwong | 711/168 |
| 6,134,632 A | * | 10/2000 | Looi et al. | 711/117 |
| 6,226,738 B1 | | 5/2001 | Dowling | |
| 6,301,637 B1 | * | 10/2001 | Krull et al. | 711/112 |
| 2003/0188105 A1 | * | 10/2003 | Middleton | 711/128 |

* cited by examiner

Primary Examiner—B. James Peikari
(74) Attorney, Agent, or Firm—Anthony V S England; Randall J. Bluestone (57) ABSTRACT

In one form, a computer system includes a system processor operable to process data. The system includes a number of memory array chips coupled to the system processor by a system bus. Such a memory array chip includes random access memory partitioned into rows, each row having a number of memory words. The random access memory has an internal buffer and the buffer is operable to hold a plurality of the memory words. Such a memory array chip includes an embedded processor and an internal bus coupling the embedded processor to the internal buffer. The internal bus is capable of concurrently transferring the plurality of memory words of the internal buffer for processing by the embedded processor.

26 Claims, 5 Drawing Sheets

METHOD AND APPARATUS FOR MEMORY WITH EMBEDDED PROCESSOR

BACKGROUND

1. Field of the Invention

This invention concerns memory array integrated circuit chips having memory for storing system processor data, and more particularly concerns such a memory array having the memory and an embedded processor on the same chip.

2. Related Art

The increasing speed and computational power of computer system processors has outpaced improvements in the speed of transferring data between processors and memory arrays. As one consequence, in an effort to keep up with the system processor's demand for data, it is even conventional to resort to speculatively transferring blocks of data to a cache near the system processor. This is done based on guesses about when is the best time to speculatively transfer the data, and what data the processor will need in the near future. For example, algorithms are used for speculative fetching which are based on locality of reference and with respect to the most recently used words, or based on identifying long sequential data strings, etc. This situation illustrates the need for improvement in data transfer between processors and memory arrays, including the need to reduce the number of data transfers on the memory-processor bus.

SUMMARY

The foregoing need is addressed in the present invention, according to one form of which a computer system includes a system processor operable to process data. The system includes a number of memory array chips coupled to the system processor by a system bus. Such a memory array chip includes a memory array partitioned into rows, each row having a number of memory words. The memory array has an internal buffer and the buffer is operable to hold a number of the memory words. Such a memory array chip includes an embedded processor and an internal bus coupling the embedded processor to the internal buffer. The internal bus is capable of concurrently transferring a plurality of the memory words of the internal buffer for processing by the embedded processor.

In another aspect, a certain number of bits of data define a width for a system processor byte, and a system processor word includes a certain number of such bytes. Such a memory word is at least system-processor-byte width.

In another form, a method includes receiving, by a memory array chip, a request for data from a system processor. The system processor is operable to process data. The method includes transferring, responsive to the request, a plurality of memory words from a memory array of the chip to an embedded processor of the chip. According to this transferring, the plurality of memory words are transferred concurrently on an internal bus of the chip. The method also includes processing the plurality of memory words concurrently by the embedded processor for selecting therefrom a memory word matching at least a byte of the requested system processor word.

Objects, advantages and other forms of the invention will be apparent upon reading the following detailed description and referring to the accompanying drawings.

DETAILED DESCRIPTION

The claims at the end of this application set out novel features which applicant believes are characteristic of the invention. The invention, a preferred mode of use, objectives and advantages, will best be understood by reference to the following detailed description of an illustrative embodiment read in conjunction with the accompanying drawings.

Figure 1:
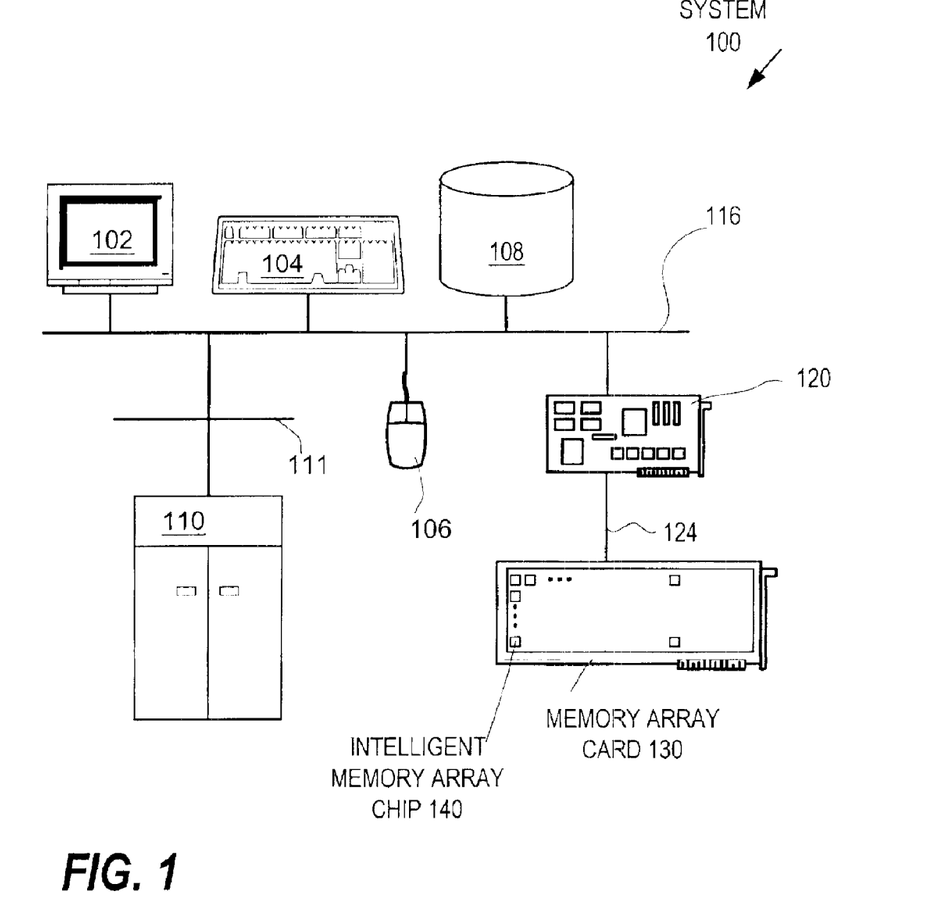
FIG. 1 illustrates a computer system, according to an embodiment of the present invention.

Referring now to FIG. 1, a computer system 100 is shown according to an embodiment of the present invention. The apparatus 100 includes one or more system processors 110 coupled to a system bus 111, and a monitor 102, keyboard 104, disk storage 108, mouse 106, bridge, and memory controller or bridge 120 coupled to an input/output bus 116. The bridge 120 is coupled to a memory array card 130 by a memory system bus 124. The memory array card 130 has a number of intelligent memory array chips 140. The disk storage 108 or memory array chips 140 have instructions operable with the processor 110 for performing certain operations described herein below. The system processor 110 is operable to process data according to a manner in which a certain number of bits of data define a width for a system processor data word. According to the illustrated embodiment, the system processor data word is thirty-two bits wide, and is divided into four bytes of eight bits per byte. The system bus 111 has at least as many data lines as the system processor data word, i.e., the data portion of the system bus 111 is at least as wide as the processor data word, so that the bus can concurrently transfer all the bits of a processor data word.

Figure 2:
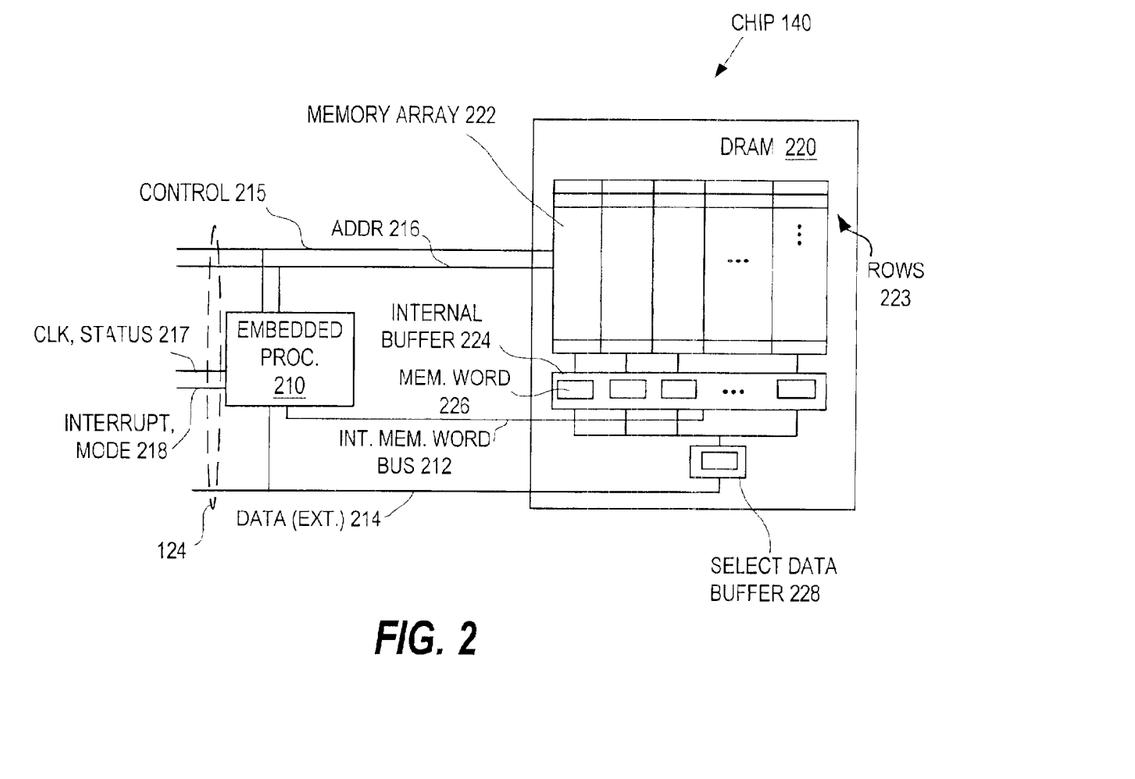
FIG. 2 illustrates details for one of the intelligent memory arrays of FIG. 1, according to an embodiment of the present invention.

Referring now to FIG. 2, details are shown for one of the intelligent memory array chips 140, according to an embodiment of the present invention. The memory system bus 124 is shown herein more detail, and includes lines for control 215, addresses 216 and data 214 coupled to a dynamic random access memory ("DRAM") 220 and an embedded processor 210. The memory system bus 124 also has clock and status lines 217 and an interrupt mode line 218 coupled to the embedded processor 210.

The DRAM 220 includes a memory array 222 partitioned into rows 223. In the illustrated embodiment each row has thirty-two memory words 226, each memory word 226 being eight bits, that is, the same width as the system processor byte. The DRAM 220 has an internal buffer 224 coupled to the array 222. The buffer 224 width is also thirty-two memory words wide, so that the buffer 224 can concurrently, i.e., in one clock cycle, receive all the memory words 226 in a row 223.

The DRAM 220 has a data buffer 228 which is one memory word wide. Memory words 226 are transferred one-at-a-time to or from the buffer 228 on the external data lines 214 of the memory system bus 124. Bus 124 also used to transfer data and instructions to embedded processors 210 in the memory array chips.

The array chip 140 also includes a thirty-two-memory-word wide internal memory word bus 212 coupling the embedded processor 210 to the buffer 224, so that all thirty-two memory words 226 of the buffer 224 can be concurrently transferred to the embedded processor 210. As will be further described in connection with FIG. 5 below, responsive to a request from the system processor 110 (FIG. 1) for a system processor word, the processor 210 can concurrently process the memory words 226 and select therefrom a word 226 matching a system processor byte corresponding to a portion of the requested system processor word.

Figure 3A:
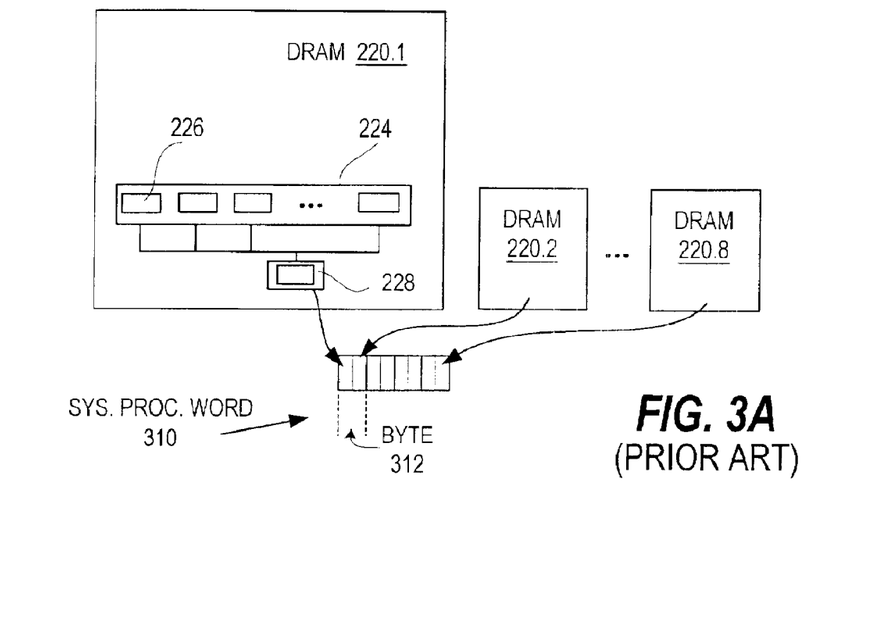
FIG. 3A illustrates dynamic random access memory chips ("DRAM" chips), according to prior art, in which DRAM-memory-word width is less than system-processor-data-byte width.
Figure 3B:
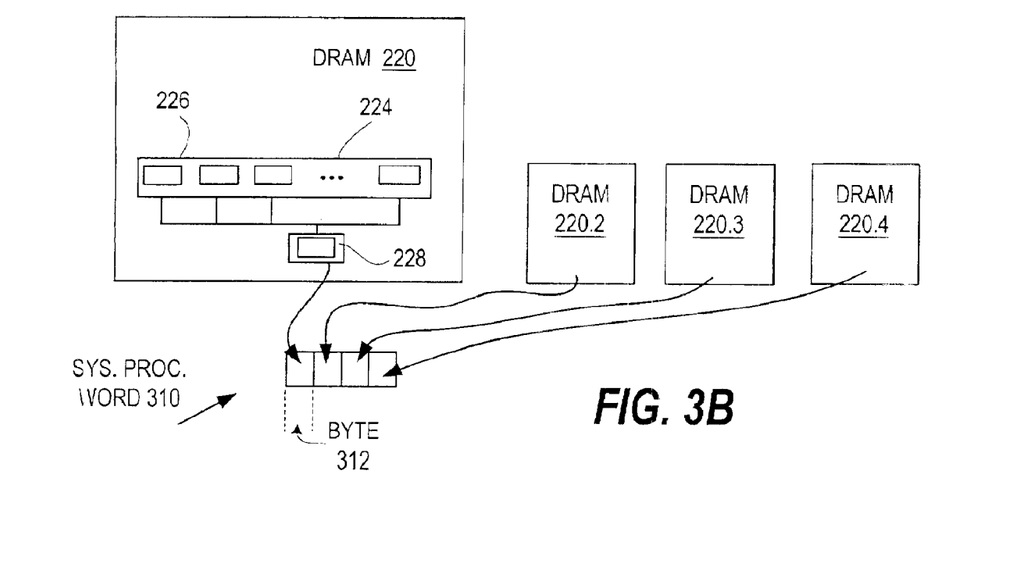
FIG. 3B illustrates DRAM's, according to an embodiment of the present invention, in which DRAM-memory-word width is the same as system-processor-data-byte width.

Referring now to FIGS. 3A and 3B, a prior art arrangement of FIG. 3A is contrasted with an embodiment of the present invention in FIG. 3B. According to both the prior art arrangement of FIG. 3A and the embodiment of the present invention of FIG. 3B, the memory word 226 of a DRAM 220 is a fraction of the width of the system processor data word 310. Accordingly, in both arrangements the memory controller 120 (FIG. 1) stores a first portion of each system processor data word 310 in a first DRAM 220, a second portion of the system processor data word 310 in a second DRAM 220, and so on, so that the bridge 120 can concurrently retrieve an entire system processor data word 310 from the select data buffers 228 of the numerous DRAM's 220 and concurrently transfer all thirty-two bits on the memory system bus 124 etc., to processor 110 (FIG. 1).

In the embodiment of the present invention in FIG. 3B, the memory word 226 is as wide as the system processor byte 312. In contrast, in the prior art arrangement of FIG. 3A the memory word 226 is only a fraction of the size of the system processor byte 312. It is advantageous to perform "search" or "sort" data operations by an embedded processor 210 (FIG. 2) on an array chip 140 with a DRAM 220 of the embodiment of FIG. 3B, because the system processor byte-width memory words 226 are logical portions of the system processor word and are wide enough for efficient processing.

Figure 4A:
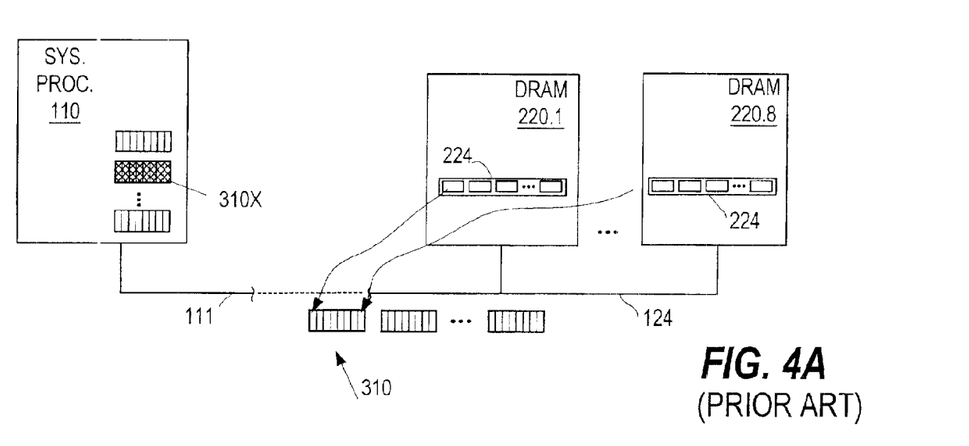
FIG. 4A illustrates transferring a number of memory words from DRAM's to a system processor and selecting by the system processor, according to prior art.
Figure 4B:
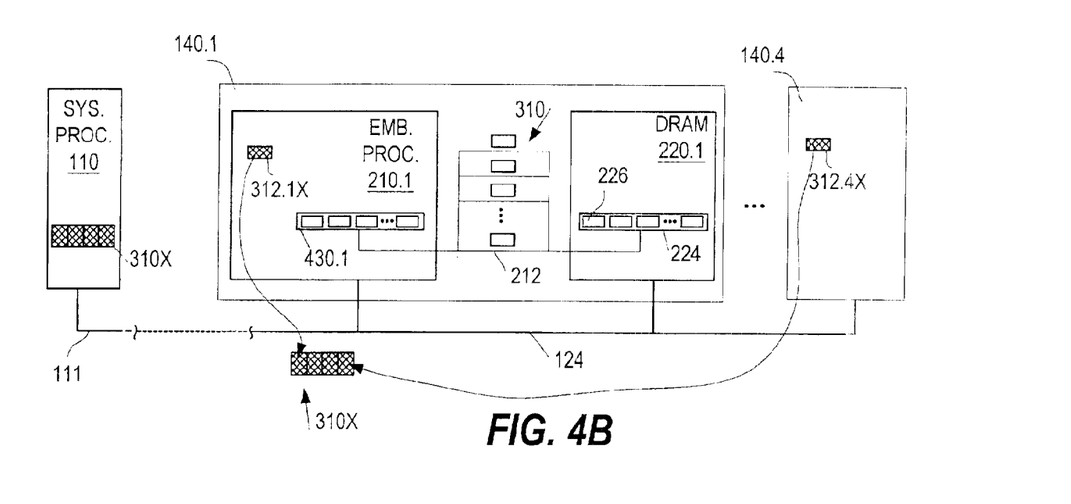
FIG. 4B illustrates additional details of an embodiment of the present invention, including memory array chips, and operations for transferring a number of memory words from DRAM's to respective embedded processors, selecting from among the memory words by the embedded processors, and transferring to a system processor.

Referring now to FIGS. 4A and 4B, additional aspects of a prior art arrangement (FIG. 4A) are contrasted with an embodiment of the present invention (FIG. 4B) to illustrate how the embodiment realizes an advantage by synergistically coupling the embedded processor 210 to internal buffer 224 via an internal bus 212 that is not limited in width by input/output constraints.

Referring now to FIG. 4A, in this prior art arrangement, responsive to the system processor 110 requesting a particular processor word 310, numerous system processor words 310 are transferred, one-at-a-time over the course of numerous data cycles, to the system bus 111 and processor 110. The processor 110 then searches through the numerous processor words 310 it has received to find the targeted word 310X.

Referring now to FIG. 4B, the advantageous arrangement of the present invention is illustrated, according to the illustrated embodiment, in which four memory array chips 140.1 through 140.4 have respective DRAM's 220.1, etc. (In FIG. 4B, details are explicitly shown for one memory array chip 140.1. It should be understood that the same details apply for each of the four array chips 140.1 through 140.4.) The DRAM's 220 have internal memory words 226 that are eight bits wide, that is, the size of one system processor byte 312 (FIG. 3B). As shown for array chip 140.1, one row of thirty-two memory words 226 is accessed from such a DRAM's memory array 222 (FIG. 2) and held temporarily in internal memory buffer 224, which is coupled via the thirty-two-memory-word-wide internal bus 212.1 to a thirty-two-word-wide buffer 430.1 in the embedded processor 210.1, so that all thirty-two memory words 226 can be transferred concurrently to the embedded processor 210.1. Then, the embedded processor 210.1 can search through the memory words 226 for a word 226 that matches a byte 312.1X corresponding to a byte of a system processor word 310X requested by the system processor 110. If all four matching bytes 312.1X through 312.4X are found in the respective array chips 140.1 through 140.4, then merely the one word 310X (i.e., the combination of bytes 312.1X through 312.4X) is transferred to the system bus 111 and processor 110. This is advantageous because words are then sent to the system processor more selectively, thereby reducing traffic on the system bus 111. This also reduces searching or sorting operations by the system processor 110.

It should be appreciated that in another embodiment of the invention, a single DRAM has memory words that are as wide as an entire system processor word. According to one embodiment, the system processor words and the DRAM memory words are thirty-two bits, and one row of thirty-two memory words is held in the internal memory buffer, which is coupled via the thirty-two-word-wide internal bus to a thirty-two-word-wide buffer in the embedded processor, so that all thirty-two memory words can be transferred concurrently to the embedded processor. Then, the embedded processor can search through the memory words for a word that entirely matches a requested system processor word. Thus the embedded processor can select an entire system processor word for transferring to the system processor.

It should also be appreciated that in the various embodiments the embedded processor 210 is not limited to finding a single processor word 310X or byte 312X, but can search for a set of targeted system processor words or bytes, such as all words or bytes thereof from address A to address A+m matching a certain bit pattern, or having a value greater than a certain given value, etc. Furthermore, the embedded processor 210 can even order a selected set of system processor words or bytes into a particular targeted sequence and then transfer the selected, ordered sequence to the system processor 110.

Figure 5:
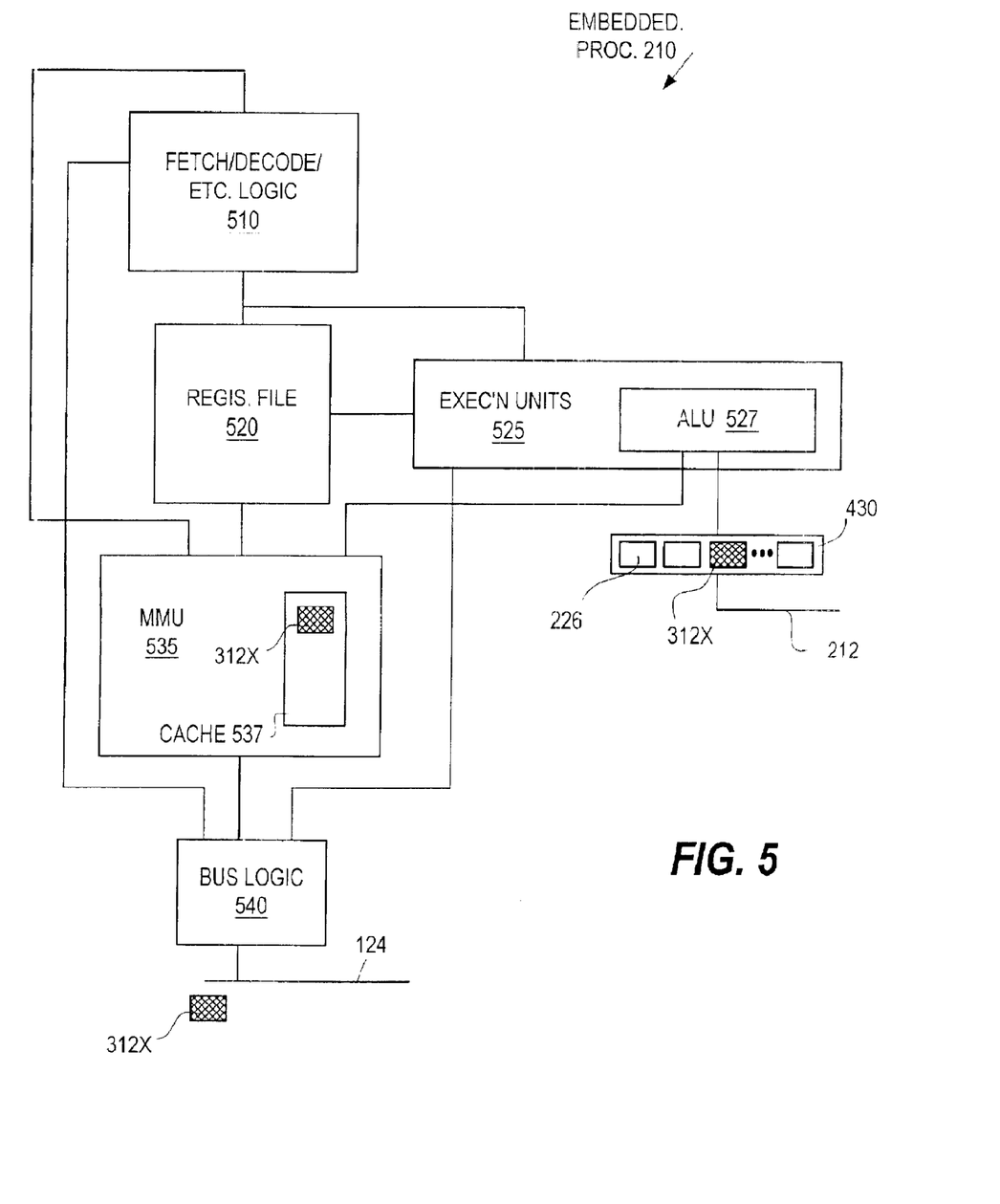
FIG. 5 illustrates details of an embedded processor, according to an embodiment of the present invention.

Referring now to FIG. 5, further details are shown of embedded processor 210, according to an embodiment of the present invention. The memory system bus 124 and other intervening buses 116 and 111 (FIG. 1) couple the system processor 110 (FIG. 1) to processor 210 and other such embedded processors in the other array chips 140 (FIG. 1). The embedded processor 210 is coupled to the bus 124 by bus logic 540 which handles communication over bus 124 according to a bus protocol. The processor 210 has a data and program memory management unit 535 which includes a cache 537 for data and instructions. (The cache may be incorporated into the DRAM 220 memory cells, or may be independent of that memory.) The processor 210 also includes logic 510 for instruction fetching, decoding, dispatching, completion, etc., and register files 520 that used by execution units 525 to hold operands and results. As previously stated, the processor 210 has a wide buffer 430 coupled to the internal bus 212. According to the embodiment of FIG. 5 the buffer 430 is thirty-two, eight-bit memory words 226 wide, the same width as the internal buffer 224 of DRAM 220. The execution units 525 include a wide arithmetic logic unit 527 coupled to the buffer 430 that can concurrently process all thirty-two words in buffer 430. The arithmetic logic unit 527 and associated control logic 310, etc. are specially tailored to do simple operations such as load, store, add, compare, logical OR, AND, exclusive OR, and NOT on the 256 bit wide group of thirty-two memory words 226 from buffer 430. Mask registers select or deselect bits and bytes from buffer 430 according to the system processor memory words/bytes specified by the system processor. The one or more selected words 226 corresponding to requested bytes 312X are transferred to cache 537 in memory management unit ("MMU") 535 for transfer to the system processor 110 via bus 124, etc.

Requests and responses between the system processor 110 and memory array chip 140, operate according to the following, in an embodiment of the present invention. The embedded processor 210 is operable such that a mode select signal from the system processor 110 (FIG. 1) on the interrupt/mode lines 218 (FIG. 2) selectively wakes up logic 510, 525, 535 etc. on the embedded processor 210 for searching or sorting, or else causes the embedded processor 210 to relinquish control of the memory array, permitting the DRAM 220 to operate in a conventional random access mode. When the memory array chip 140 (FIG. 2) is switched to the random access mode, the logic 510, etc. saves the processor 210 state. Then, upon being switched back to the intelligent mode of operation by the mode select signal on lines 218, the logic 510, etc. retrieves the embedded processor 210 state and resumes searching or sorting where it left off. The searching and sorting are responsive to instructions, data and addresses received from the system processor 110 by the embedded processor 210 via bus 124, etc.

Once the processor 210 has completed a search or sort operation requested by system processor 110, embedded processor 210 notifies system processor 110 via bus 124 status lines 217 (FIG. 2) and memory controller 120 (FIG. 1) that requested data has been found and is ready. In the circumstance such as that illustrated in FIGS. 3B, 4B and 5, where the DRAM associated with the embedded processor 210 has only a one-byte portion of a requested four-byte system processor word, a match of the DRAM memory word with the corresponding byte of the requested system processor word does not guarantee that the other three DRAM memory words will match their corresponding bytes of the system processor word. Therefore the system processor 110 waits for indications from the embedded processors for all four array chips 140.1 through 140.4 as to whether the four respective memory words 226.1 through 226.4 match the corresponding bytes of the requested system processor word. Then, if a match of the entire system processor word is indicated, the system processor 110 signals the embedded processors 210.1 through 210.4 via status lines 217 to send their respective bytes 312.1 through 312.4, and the embedded processors transfer the selected bytes via bus 124, etc.

There is currently a trend to wider DRAM memory words. From the above description it should be appreciated that the present invention takes advantage of this trend to enhance functionality of a computer system by embedding with DRAMs having wide memory words, certain data transfer structures, and intelligence having selective preprocessing power. In so doing, two levels of parallel processing are achieved. In a first aspect of parallel processing, each embedded processor associated with a DRAM uses its own wide arithmetic logic unit to concurrently operate on numerous DRAM memory words from the wide DRAM internal buffer. In a second aspect, each of the many memory arrays in the system concurrently preprocess data in their own respective address spaces. It should also be appreciated that these advantages are achieved in a manner that maintains many of the general characteristics of conventional DRAM.

For example, both the above described aspects of parallel, embedded processing are initiated at the discretion of the system processor. If embedded processing is not initiated the DRAM's operate in a conventional fashion.

The description of the present embodiments have been presented for purposes of illustration, but are not intended to be exhaustive or to limit the invention to the forms disclosed. Many additional aspects, modifications and variations are also contemplated and are intended to be encompassed within the scope of the following claims. For example, in another embodiment the DRAM 220 is static random access memory. In various embodiments the system processor a word 310, system processor byte 312, and bus widths vary in size. For example, in one embodiment the system processor word is 64 bits wide and the buses 111, etc. are wide enough to concurrently transfer all the bits of a system processor word. In various embodiments the arithmetic logic unit 527 is capable of concurrently processing all the memory words 226 from an entire row 223 of the DRAM 220, or is capable of concurrently processing merely a subset of the words 226 from a row 223. Likewise, in various embodiments the internal buffer 224 width and the embedded processor 210 buffer 430 width include all memory words 226 in a row 223, or merely some of the words 226. In various embodiments the internal memory word bus 212 is capable of concurrently transferring all the memory words 226 from an entire row 223 of the DRAM 220, or is capable of concurrently transferring merely a subset of the words 226 from a row 223.

Although system 100 of FIG. 1 has been shown as a relatively full-featured computer system, such as a server or desktop system, it should be understood that the invention is equally applicable in other embodiments. For example, various embodiments include notebook computers and personal digital assistants, among others.

To reiterate, many additional aspects, modifications and variations are also contemplated and are intended to be encompassed within the scope of the following claims. Moreover, it should be understood that actions in the following claims do not necessarily have to be performed in the particular sequence in which they are set out.

What is claimed is:

1. A computer system comprising:
   a system processor operable to process data; and
   a number of memory array chips coupled to the system processor by a system bus, wherein such a memory array chip comprises:
   a memory array partitioned into rows, each row having a number of memory words, the memory array has an internal buffer and the buffer is operable to hold a number of the memory words;
   an embedded processor; and
   an internal bus coupling the embedded processor to the internal buffer and capable of concurrently transferring a plurality of the memory words of the internal buffer for processing by the embedded processor.

2. The system of claim 1 wherein a certain number of bits of data define a width for a system processor byte, and a system processor word includes a certain number of such bytes, and wherein such a memory word is at least system-processor-byte width.

3. The computer system of claim 2, wherein the system processor is operable to request data from the memory array chips, the requested data including a system processor word, and the embedded processor comprises an arithmetic logic unit operable to concurrently process the plurality of memory words for selecting therefrom a memory word matching at least a byte of the requested system processor word.

4. The computer system of claim 3, wherein the internal buffer is operable to bold an entire row of the memory words, and the internal bus is operable to concurrently transfer all the internal buffer memory words.

5. The computer system of claim 3, wherein such a memory word is system-processor-word width, and the selecting by the arithmetic logic unit selects a memory word matching the entire requested system processor word.

6. The computer system of claim 3, wherein the memory array chip is operable to receive a mode select signal initiated by the system processor, and wherein the embedded processor comprises logic for saving a state of the embedded processor and relinquishing control of the memory array responsive to the mode select signal.

7. The computer system of claim 3, wherein the requested data includes a plurality of system processor words, the memory array comprises a cache for storing a plurality of memory words selected by the arithmetic logic unit, and the embedded processor is operable for sending a notification responsive to the embedded processor being ready to send the selected memory words.

8. A memory array chip for a computer system having a system processor operable to process data, the memory array chip comprising:
a memory array partitioned into rows, each row having a number of memory words, the memory array having an internal buffer operable to hold a number of the memory words;
an embedded processor; and
an internal bus coupling the embedded processor to the internal buffer, and the internal bus is capable of concurrently transferring a plurality of the memory words of the internal buffer for processing by the embedded processor.

9. The system of claim 8 wherein a certain number of bits of data define a width for a system processor byte, and a system processor word includes a certain number of such bytes, and wherein such a memory word is at least system-processor-byte width.

10. The memory array chip of claim 9, wherein the system processor is operable to request data from the memory array chip, the requested data including a system processor word, and the embedded processor comprises an arithmetic logic unit operable to concurrently process the plurality of memory words for selecting therefrom a memory word matching at least a byte of the requested system processor word.

11. The memory array chip of claim 10, wherein the internal buffer is operable to hold an entire row of the memory words, and the internal bus is operable to concurrently transfer all the internal buffer memory words.

12. The memory array chip of claim 10, wherein such a memory word is system-processor-word width, and the selecting by the arithmetic logic unit selects a memory word matching the entire requested system processor word.

13. The memory array chip of claim 10, wherein the chip is operable to receive a mode select signal initiated by the system processor, and the embedded processor comprises logic for saving a state of the embedded processor and relinquishing control of the memory array responsive to the mode select signal.

14. The memory array chip of claim 10, wherein the requested data includes a plurality of system processor words, the memory array comprises a cache for storing a plurality of memory words selected by the arithmetic logic unit, and the embedded processor is operable for sending a notification responsive to the embedded processor being ready to send the selected memory words.

15. A method comprising:
receiving, by a memory array chip, a request for data, wherein the request for data includes a request for a system processor word;

transferring responsive to the request, a plurality of memory words from a memory array to an embedded processor of the chip, wherein the plurality of memory words are transferred concurrently on an internal bus of the chip; and
processing the plurality of memory words concurrently by the embedded processor for selecting therefrom a memory word matching at least a byte of the requested system processor word.

16. The system of claim 15 wherein a certain number of bits of data define a width for a system processor byte and the requested system processor word includes a certain number of such bytes.

17. The method of claim 16, wherein the memory array includes rows of the memory words, the method comprising:
holding an entire row of the memory words in an internal buffer of the memory array chip, wherein the internal bus is operable to concurrently transfer all the internal buffer memory words.

18. The method of claim 17, comprising:
receiving, by the memory array chip, a mode select signal initiated by the system processor; and
saving a state of the embedded processor and relinquishing control of the memory array by the embedded processor responsive to the mode select signal.

19. The method of claim 17, wherein the requested data includes a plurality of system processor words, and the method comprises:
storing, on the memory array chip, a plurality of memory words selected by the arithmetic logic unit; and
sending a notification by the embedded processor responsive to the embedded processor being ready to send the selected memory words.

20. The method of claim 16, wherein such a memory word is system-processor-word width, and wherein the method comprises selecting, by the embedded processor, a memory word matching the entire requested system processor word.

21. An apparatus comprising:
means for receiving, by a memory array chip, a request for data, wherein the request for data includes a request for a system processor word;
a means for transferring, responsive to the request, a plurality of memory words from a memory array of the chip to an embedded processor of the chip, wherein the plurality of memory words are transferred concurrently on an internal bus of the chip; and
means for processing the plurality of memory words concurrently by the embedded processor for selecting therefrom a memory word matching at least a byte of the requested system processor word.

22. The apparatus of claim 21 wherein a certain number of bits of data define a width for a system processor byte and the system processor word includes a certain number of such bytes.

23. The apparatus of claim 22, wherein the memory array includes rows of the memory words, the apparatus comprising:
means for holding an entire row of the memory words in an internal buffer of the memory array chip, wherein the internal bus is operable to concurrently transfer all the internal buffer memory words.

24. The apparatus of claim 23, comprising the steps of:
means for receiving, by the memory array chip, a mode select signal initiated by the system processor, and means for saving a state of the embedded processor and relinquishing control of the memory array by the embedded processor responsive to the mode select signal.

25. The apparatus of claim 23, wherein the requested data includes a plurality of system processor words, and the apparatus comprises:

means for storing, on the memory array chip, a plurality of memory words selected by the arithmetic logic unit; and means for sending a notification by the embedded processor responsive to the embedded processor being ready to send the selected memory words.

26. The apparatus of claim 22, wherein such a memory word is system-processor-word width, and wherein the embedded processor comprises means for selecting a memory word matching the entire requested system processor word.

* * * * *